US008670809B2

(12) United States Patent
Thom et al.

(10) Patent No.: US 8,670,809 B2
(45) Date of Patent: Mar. 11, 2014

(54) SYSTEMS AND DEVICES FOR ELECTRICAL FILTERS

(71) Applicant: D-Wave Systems Inc., Burnaby (CA)

(72) Inventors: Murray C. Thom, Vancouver (CA); Sergey Uchaykin, Burnaby (CA); Thomas Mahon, Vancouver (CA); David Pires, North Vancouver (CA); Peter Spear, Vancouver (CA); Jacob Craig Petroff, Vancouver (CA)

(73) Assignee: D-Wave Systems Inc., Burnaby (CA)

( * ) Notice: Subject to any disclaimer, the term of this patent is extended or adjusted under 35 U.S.C. 154(b) by 0 days.

(21) Appl. No.: 13/707,210

(22) Filed: Dec. 6, 2012

(65) Prior Publication Data

US 2013/0217580 A1 Aug. 22, 2013

Related U.S. Application Data

(63) Continuation of application No. 13/011,697, filed on Jan. 21, 2011, now Pat. No. 8,346,325.

(60) Provisional application No. 61/298,070, filed on Jan. 25, 2010.

(51) Int. Cl.
*H01L 39/24* (2006.01)

(52) U.S. Cl.
USPC .......................................................... 505/231

(58) Field of Classification Search
USPC .......... 505/210, 230, 231; 333/202, 204, 206, 333/99 S
See application file for complete search history.

(56) References Cited

U.S. PATENT DOCUMENTS

| | | | | |
|---|---|---|---|---|
| 5,616,539 | A | 4/1997 | Hey-Shipton et al. | 505/210 |
| 5,618,777 | A | 4/1997 | Hey-Shipton et al. | 505/210 |
| 5,917,066 | A | 6/1999 | Eisenmann et al. | 55/502 |
| 5,937,263 | A | 8/1999 | Eisenmann et al. | 419/2 |
| 7,456,702 | B2 | 11/2008 | Keefe et al. | 333/99 S |
| 7,791,430 | B2 | 9/2010 | Keefe et al. | 333/99 S |
| 2008/0176751 | A1 | 7/2008 | Tcaciuc et al. | 505/210 |
| 2008/0258849 | A1 | 10/2008 | Keefe et al. | 333/99 S |
| 2008/0284545 | A1 | 11/2008 | Keefe et al. | 333/204 |
| 2009/0085694 | A1 | 4/2009 | Keefe et al. | 333/206 |
| 2009/0102580 | A1 | 4/2009 | Uchaykin | 333/185 |
| 2010/0157552 | A1 | 6/2010 | Thom et al. | 361/752 |

FOREIGN PATENT DOCUMENTS

WO 2008/086627 8/2006

OTHER PUBLICATIONS

Bladh et al., "Comparison of Cryogenic Filters for Use in Single Electronics Experiments," *Review of Scientific Instruments 74*(3):1323-1327, 2003.

Fukushima et al., "Attenuation of Microwave Filters for Single-Electron Tunneling Experiments," *IEEE Transactions of Instrumentation and Measurement 46*(2):289-293, 1997.

(Continued)

*Primary Examiner* — Colleen Dunn
(74) *Attorney, Agent, or Firm* — Seed IP Law Group PLLC

(57) ABSTRACT

Adaptations and improvements to tubular metal powder filters include employing cross sectional geometries of any suitable shape, aligning the inner conductor off-axis, replacing the inner conductive wire with a conductive trace or a superconductive trace carried by a printed circuit board, combining multiple filters within a single common outer conductive housing, and employing meandering and other non-parallel signal paths. The various adaptations and improvements are designed to accommodate single-ended and differential signaling, as well as superconducting and non-superconducting applications.

27 Claims, 9 Drawing Sheets

(56) References Cited

OTHER PUBLICATIONS

Illarionov et al., "Calculation of Corregated and Partially Filled Waveguides," Moscow, Soviet Radio, 1980, pp. 164-171 (Printed in Russian).

Martinis et al., "Experimental Tests for the Quantum Behavior of a Macroscopic Degree of Freedom: The Phase Difference Across a Josephson Junction," *Physical Review B 35*(10):4682-4698, 1987.

Martinis, "Macroscopic Quantum Tunneling and Energy-Level Quantization in the Zero Voltage State of the Current-Biased Josephson Junction," Ph.D. Thesis, Department of Physics, University of California, Berkeley, Nov. 11, 1985, 100 pages.

Off-Center Coax, URL=http://www.microwaves101.com/encyclopedia/coax_offcenter.cfm, download date Jan. 21, 2010, 3 pages.

Pobell, "Matter and Methods at Low Temperatures," Springer-Verlag, Second Edition, 120-156, 1996.

Thom et al., "Input/Output System and Devices for Use With Superconducting Devices," U.S. Appl. No. 12/016,801, filed Jan. 18, 2008, 132 pages.

Thom et al., "Systems and Devices for Electrical Filters," Office Action mailed May 22, 2012 for U.S. Appl. No. 13/011,697, 6 pages.

Thom et al., "Systems and Devices for Electrical Filters," Amendment filed Aug. 14, 2012 for U.S. Appl. No. 13/011,697, 9 pages.

SYSTEMS AND DEVICES FOR ELECTRICAL FILTERS

BACKGROUND

Field

The present systems and devices generally relate to electrical filters and particularly relate to superconducting high frequency dissipation filters employing tubular geometries.

Refrigeration

According to the present state of the art, a superconducting material may generally only act as a superconductor if it is cooled below a critical temperature that is characteristic of the specific material in question. For this reason, those of skill in the art will appreciate that an electrical system that implements superconducting components may implicitly include a refrigeration system for cooling the superconducting materials in the system. Systems and methods for such refrigeration systems are well known in the art. A dilution refrigerator is an example of a refrigeration system that is commonly implemented for cooling a superconducting material to a temperature at which it may act as a superconductor. In common practice, the cooling process in a dilution refrigerator may use a mixture of at least two isotopes of helium (such as helium-3 and helium-4). Full details on the operation of typical dilution refrigerators may be found in F. Pobell, *Matter and Methods at Low Temperatures*, Springer-Verlag Second Edition, 1996, pp. 120-156. However, those of skill in the art will appreciate that the present systems and devices are not limited to applications involving dilution refrigerators, but rather may be applied using any type of refrigeration system.

Metal Powder Filters

First introduced in 1985 in a PhD thesis entitled "Macroscopic Quantum Tunneling and Energy-Level Quantization in the Zero Voltage State of the Current-Biased Josephson Junction" by John Martinis of the University of California, Berkeley, the metal powder filter is a form of high frequency dissipation filter. In its most general form, the metal powder filter employs a hollow conductive housing having an inner volume that is filled with a mixture of metal powder and epoxy. A portion of a conductive wire extends through the inner volume of the housing such that the portion of the conductive wire is completely immersed in the metal powder epoxy mixture. The particles of the metal powder are conductive and together provide a very large surface area over which high frequency signals carried on the conductive wire are dissipated via skin-effect damping. In the PhD thesis, Martinis employs a cylindrical tubular geometry for the outer conductive housing and two different variants for the inner conductive wire. In the first variant, the inner conductive wire is coiled around the longitudinal axis within the tubular housing in order to maximize the contact surface area between the conductive wire and the metal powder epoxy mixture. In the second variant, the inner conductive wire is straight to realize a coaxial geometry in the filter. Throughout this specification, a metal powder filter employing a cylindrical tubular outer conductor and an inner conductive wire (either coiled or straight/coaxial) is generally referred to as the "Martinis Design." Much of this thesis work, including both variants of the Martinis Design, was subsequently re-published two years later in Martinis et al., Physical Review B, 35, 10, Apr. 1987. The Martinis Design has also been characterized and implemented by others, such as in Fukushima et al., IEEE Transactions on Instrumentation and Measurement, 46, 2, April 1997 and Bladh et al., Review of Scientific Instruments, 74, 3, Mar. 2003. Furthermore, metal powder filters of the coaxial-type are described in U.S. Pat. No. 7,456,702 and US Patent Application Publication 2009-0085694 (now U.S. Pat. No. 7,791,430) and a variant employing a planar buried strip line geometry is described in US Patent Publication US 2008-0284545.

Metal powder filters have particular utility in superconducting applications, such as in the input/output system providing electrical communication to/from a superconducting computer processor. For example, a multi-metal powder filter assembly is employed for this purpose in U.S. patent application Ser. No. 12/016,801. The multi-filter assembly includes a single conductive volume through which multiple through-holes are bored to provide a set of longitudinal passages. Each filter is realized by a respective coiled conductive wire extending through each passage, where the volume of each passage is filled with a mixture of metal powder and epoxy. The multi-filter assembly therefore provides multiple Martinis Design filters in one structure. In another example, the inner conductive wire of the Martinis Design is replaced by a printed circuit board (PCB) carrying conductive traces and lumped elements such as capacitors, inductors, and/or resistors. Versions of this design that employ single-ended signaling are described in US Patent Publication 2008-0176751, while version of this design that are adapted to employ differential signaling are described in U.S. patent application Ser. No. 12/503,671 (now U.S. Patent Application Publication 2010-0157552).

Single-Ended Signaling vs. Differential Signaling

Single-ended signaling is a term used to describe a simple wiring approach whereby a varying voltage that represents a signal is transmitted using a single wire. This single-ended signal is typically referenced to an absolute reference voltage provided by a positive or negative ground or another signal somewhere in the system. For a system that necessitates the transmission of multiple signals (each on a separate signal path), the main advantage of single-ended signaling is that the number of wires required to transmit multiple signals is simply equal to the number of signals plus one for a common ground. However, single-ended signaling can be highly susceptible to noise that is picked up (during transmission) by the signal wire and/or the ground path, as well as noise that results from fluctuations in the ground voltage level throughout the system. In single-ended signaling, the signal that is ultimately received and utilized by a receiving circuit is equal to the difference between the signal voltage and the ground or reference voltage at the receiving circuit. Thus, any fluctuations in the signal and/or reference voltage that occur between sending and receiving the signal can result in a discrepancy between the signal that enters the signal wire and the signal that is received by the receiving circuit.

Differential signaling is a term used to describe a wiring approach whereby a data signal is transmitted using two complementary electrical signals propagated through two separate wires. A first wire carries a varying voltage (and/or current) that represents the data signal and a second wire carries a complementary signal that may be equal and opposite to the data signal. The complementary signal in the second wire is typically used as the particular reference voltage for each differential signal, as opposed to an absolute reference voltage throughout the system. In single-ended signaling, a single ground is typically used as a common signal return path. In differential signaling, a single ground may also be provided as a common return path for both the first wire and the second wire, although because the two signals are substantially equal and opposite they may cancel each other out in the return path.

Differential signaling has the advantage that it is less susceptible to noise that is picked up during signal transmission and it does not rely on a constant absolute reference voltage. In differential signaling, the signal that is ultimately received and utilized by a receiving circuit is equal to the difference between the data signal voltage (and/or current) carried by the first wire and the complementary signal voltage (and/or current) carried by the second wire. There is no absolute ground reference voltage. Thus, if the first wire and the second wire are maintained in close proximity throughout the signal transmission, any noise coupled to the data signal is likely also to couple to the reference signal and therefore any such noise may be cancelled out in the receiving circuit. Furthermore, because the data signal and the complementary signal are, typically, roughly equal in magnitude but opposite in sign, the signal that is ultimately received and utilized by the receiving circuit may be approximately twice the magnitude of the data signal alone. These effects can help to allow differential signaling to realize a higher signal-to-noise ratio than single-ended signaling. The main disadvantage of differential signaling is that it uses approximately twice as many wires as single-ended signaling. However, in some applications this disadvantage is more than compensated by the improved signal-to-noise ratio of differential signaling.

BRIEF SUMMARY

An electrical filter may be summarized as including a tubular outer conductor having an outer surface and a longitudinal passage; a first inner conductor that extends through the longitudinal passage, wherein the first inner conductor includes a first conductive trace carried by a printed circuit board; and a filler material including a metal powder, the filler material disposed in the longitudinal passage, wherein the outer conductor has an inner diameter, and wherein a width of the printed circuit board is approximately equal to the inner diameter of the outer conductor. The first inner conductor may include a first superconductive trace carried by the printed circuit board. The longitudinal passage may have a longitudinal center axis and the first conductive trace may extend substantially parallel to the longitudinal center axis of the longitudinal passage. In some embodiments, the first conductive trace may extend collinearly with the longitudinal center axis of the longitudinal passage. The longitudinal passage may have a longitudinal center axis, and the first conductive trace may follow a meandering path through the longitudinal passage, the meandering path characterized by at least one change in direction with respect to the longitudinal center axis. The filler material may include an epoxy and the metal powder may include at least one of copper powder or brass powder. The outer surface of the tubular outer conductor may have a cross sectional geometry that is non-circular. In some embodiments, the electrical filter may include an additional inner conductor extending through the longitudinal passage, wherein the additional inner conductor includes an additional conductive trace carried by the printed circuit board. The additional inner conductor may be configured to carry a complementary signal. In some embodiments, the additional inner conductor may include an additional superconductive trace carried by the printed circuit board. The longitudinal passage may have a longitudinal center axis and both the first conductive trace and the additional conductive trace may extend substantially parallel to the longitudinal center axis of the longitudinal passage.

An electrical filter may be summarized as including a tubular outer conductor having an outer surface and a longitudinal passage, wherein the outer surface of the tubular outer conductor has a cross sectional geometry that is non-circular; a first inner conductor that extends through the longitudinal passage, wherein the first inner conductor includes a first conductive trace carried by a printed circuit board; and a filler material including a metal powder, the filler material disposed in the longitudinal passage. The first inner conductor may include a first superconductive trace carried by the printed circuit board. The longitudinal passage may have a longitudinal center axis and the first conductive trace may extend parallel to the longitudinal center axis of the longitudinal passage. In some embodiments, the first conductive trace may extend collinearly with the longitudinal center axis of the longitudinal passage. The longitudinal passage may have a longitudinal center axis, and the first conductive trace may follow a meandering path through the longitudinal passage, the meandering path characterized by at least one change in direction with respect to the longitudinal center axis. The outer conductor has an inner diameter, and wherein a width of the printed circuit board is approximately equal to the inner diameter of the outer conductor. The filler material may include an epoxy and the metal powder may include at least one of copper powder or brass powder. In some embodiments, the electrical filter may include an additional inner conductor that may extend through the longitudinal passage, wherein the additional inner conductor includes an additional conductive trace carried by the printed circuit board. The additional inner conductor may be configured to carry a complementary signal. In some embodiments, the additional inner conductor may include an additional superconductive trace carried by the printed circuit board. The longitudinal passage may have a longitudinal center axis and both the first conductive trace and the additional conductive trace may extend substantially parallel to the longitudinal center axis of the longitudinal passage.

An electrical filter may be summarized as including a tubular outer conductor having an outer surface and a longitudinal passage; a first inner conductor that extends through the longitudinal passage, wherein the first inner conductor includes a first conductive trace carried by a printed circuit board; and a filler material including a metal powder, the filler material disposed in the longitudinal passage, wherein the outer conductor has an inner cross sectional width spanning along a major axis, and wherein a width of the printed circuit board is approximately equal to the inner cross sectional width of the outer conductor. The first inner conductor may include a first superconductive trace carried by the printed circuit board. The outer conductor has an outer cross sectional width spanning along the major axis of the outer conductor, the outer cross sectional width being larger than the inner cross sectional width and wherein the width of the printed circuit board is larger than the inner cross sectional width of the outer conductor and smaller than the outer cross sectional width of the outer conductor. The inner conductor may include at least one slot for receiving at least one edge of the printed circuit board. The outer surface of the tubular outer conductor may have a cross sectional geometry that is non-circular.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been solely selected for ease of recognition in the drawings.

DETAILED DESCRIPTION

In the following description, some specific details are included to provide a thorough understanding of various disclosed embodiments. One skilled in the relevant art, however, will recognize that embodiments may be practiced without one or more of these specific details, or with other methods, components, materials, etc. In other instances, well-known structures associated with electrical filters, such as input/output terminals and connectors, solder joints, and input/output wiring have not been shown or described in detail to avoid unnecessarily obscuring descriptions of the embodiments of the present systems and devices.

Unless the context requires otherwise, throughout the specification and claims which follow, the word “comprise” and variations thereof, such as, “comprises” and “comprising” are to be construed in an open, inclusive sense, that is as “including, but not limited to.”

Reference throughout this specification to “one embodiment,” or “an embodiment,” or “another embodiment” means that a particular referent feature, structure, or characteristic described in connection with the embodiment is included in at least one embodiment. Thus, the appearances of the phrases “in one embodiment,” or “in an embodiment,” or “another embodiment” in various places throughout this specification are not necessarily all referring to the same embodiment. Furthermore, the particular features, structures, or characteristics may be combined in any suitable manner in one or more embodiments.

It should be noted that, as used in this specification and the appended claims, the singular forms “a,” “an,” and “the” include plural referents unless the content clearly dictates otherwise. Thus, for example, reference to an electrical filter including “an inner conductor” includes a single inner conductor, or two or more inner conductors. It should also be noted that the term “or” is generally employed in its sense including “and/or” unless the content clearly dictates otherwise.

The headings provided herein are for convenience only and do not interpret the scope or meaning of the embodiments.

The various embodiments described herein provide systems and devices for metal powder filters that are adapted from the Martinis Design to accommodate system requirements and/or achieve some specific function.

Figure 1:
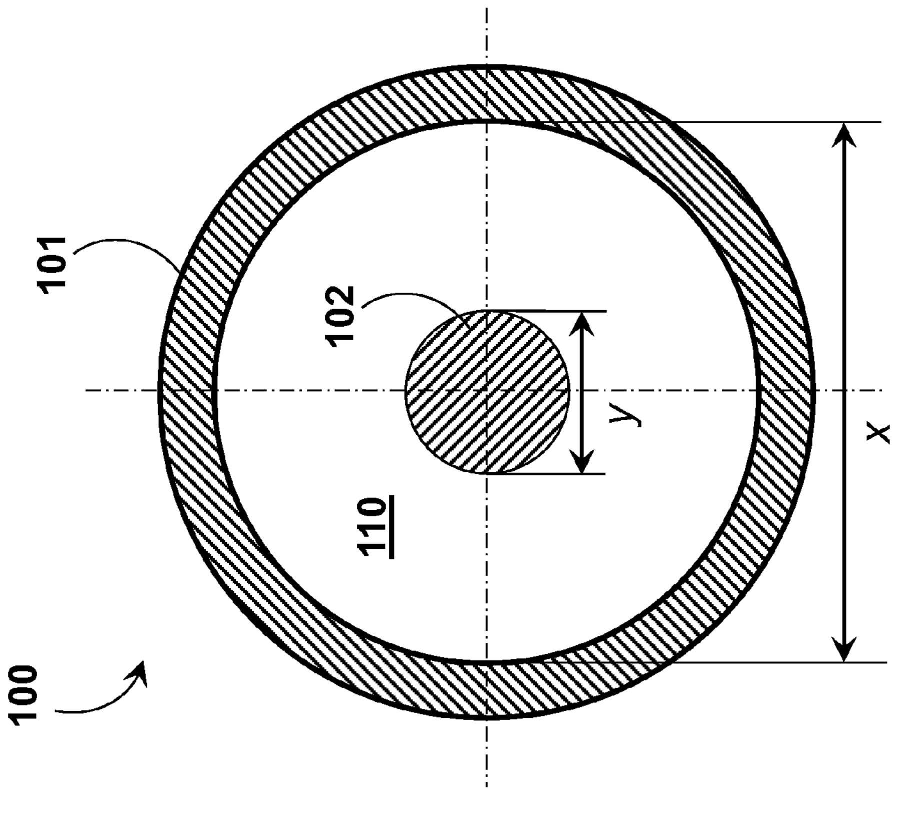
PRIOR ART FIGURE 1
FIG. 1 is a sectional view of a metal powder filter embodying the coaxial variant of the Martinis Design.

FIG. 1 is a sectional view of a metal powder filter 100 embodying the coaxial variant of the Martinis Design. Metal powder filter 100 employs a tubular geometry and includes a cylindrical outer conductive housing 101 and an inner conductive wire 102 that is arranged coaxially therein. The cylindrical volume 110 defined between the inner surface of the outer conductive housing 101 and the outer surface of the inner conductive wire 102 is filled with a mixture of metal powder and epoxy (not shown in the Figure). The metal powder epoxy mixture has a dielectric constant E, the outer conductive housing 101 has an inner diameter x and the inner conductive wire 102 has a diameter y. As is well known in the art, the characteristic impedance Z of this coaxial geometry is given by equation 1:

$$Z = \frac{138}{\sqrt{E}}\log\left(\frac{x}{y}\right) \tag{1}$$

In some applications of metal powder filters, it is desirable for the filter to be characterized by a specific impedance. The coaxial variant of the Martinis Design may be constructed with specific parameters for E, x, and y in order to achieve a specific impedance Z in accordance with equation 1. However, in some cases in can be difficult to produce the precise coaxial alignment between the inner conductive wire 102 and the outer conductive housing 101 that is necessary in order to ensure that the characteristic impedance Z of the filter is accurately given by equation 1. In practical implementations the inner conductive wire will often be positioned off-axis inside the outer conductive housing. Thus, rather than struggling to precisely align the inner conductive wire 102 along the axis of (i.e., coaxially with) the outer conductive housing 101, it may be more practical to deliberately position the inner conductive wire off-axis as shown in FIG. 2.

Figure 2:
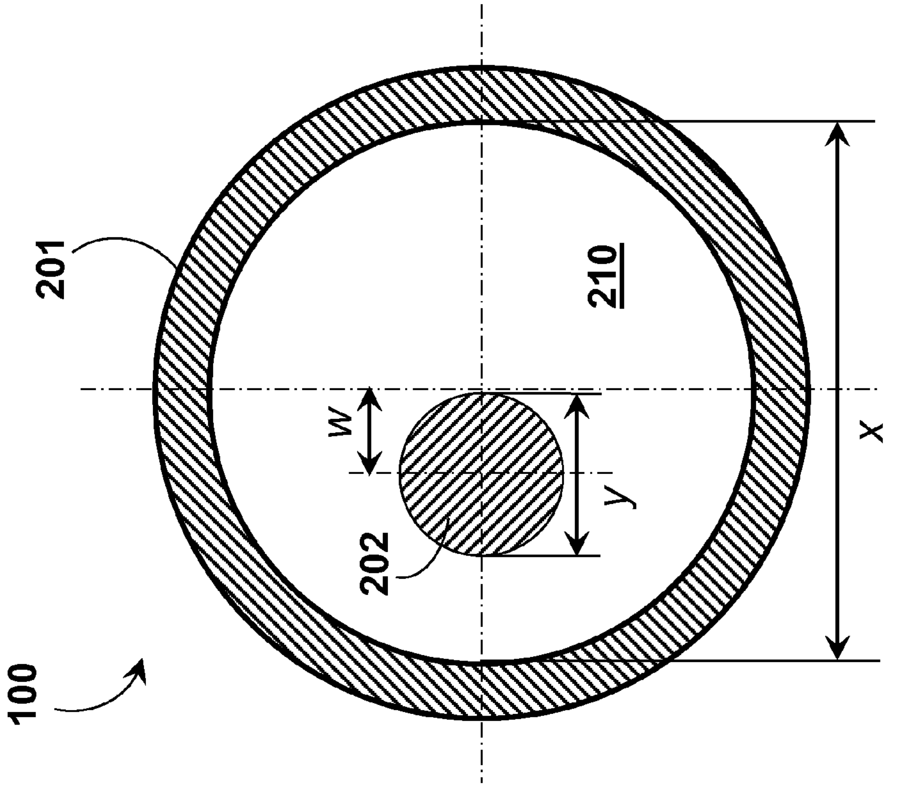
FIG. 2 is a sectional view of an off-center coaxial metal powder filter employing a cylindrical outer conductive housing and an inner conductive wire that is arranged off of the longitudinal axis, according to an embodiment of the present systems and devices.

FIG. 2 is a sectional view of an off-center coaxial metal powder filter 200 employing a cylindrical outer conductive housing 201 and an inner conductive wire 202 that is arranged off of the longitudinal axis by an amount w. Metal powder filter 200 is an adaptation of the coaxial Martinis Design where the inner conductive wire 202 has been moved off-center within the outer conductive housing 201 in order to relax the fabrication requirements. Similar to filter 100 from FIG. 1, the cylindrical volume 210 defined between the inner surface of the outer conductive housing 201 and the outer surface of the inner conductive wire 202 is filled with a mixture of metal powder and epoxy (not shown in the Figure). The metal powder epoxy mixture has a dielectric constant E, the outer conductive housing 201 has an inner diameter x and the inner conductive wire 202 has a diameter y. In the illustrated embodiment, the inner conductive wire 202 extends parallel to the outer conductive housing 201. In this configuration, the characteristic impedance Z of filter 200 is given by equation 2, taken from www.microwaves101.com/encyclopedia/coax_offcenter.cfm (last accessed Thursday, Jan. 21, 2010):

$$Z = \frac{60}{\sqrt{E}} a\cosh\left[\frac{1}{2}\left(\frac{x}{y} + \frac{y}{x} - \frac{4w^2}{xy}\right)\right] \quad (2)$$

In accordance with the present systems and devices, the off-center coaxial metal powder filer 200 may be easier to reliably fabricate than the precise coaxial geometry employed in the Martinis Design and still provides a predictable characteristic impedance that may be tailored to meet system requirements. FIG. 2 illustrates an inner conductive wire 202 that extends parallel to the outer conductive housing 201; however, in alternative embodiments the inner conductive wire 202 may extend in a straight line that is not parallel to the outer conductive housing 201 such that the inner conductive wire 202 is positioned off-center by an amount $w_1$ at a first end of filter 200 and by an amount $w_2$ at a second end of filter 200. In such embodiments, the characteristic impedance Z may not be given by equation 2, but rather may be approximated by, for example, calculating the average characteristic impedance $Z_{av}$ according to equation 3:

$$Z_{av} = \frac{|Z(w_2) - Z(w_1)|}{2} \quad (3)$$

where $Z(w_2)$ invokes equation 2 for off-center distance $w_2$ and $Z(w_1)$ invokes equation 2 for off-center distance $w_1$.

The use of a cylindrical geometry for the outer conductive housing (e.g., 101, 201) in a metal powder filter may not, in some applications (e.g., cryogenic applications employing superconductive wiring), provide the best contact surface area for thermalization of the device. For example, if the filter is to be thermalized by physical contact with a flat surface (e.g., a flat surface within a cryogenic refrigeration system), then the cylindrical geometry employed in the Martinis Design can only provide limited, tangential physical contact between the filter body and the flat surface, as illustrated in FIG. 3.

Figure 3:
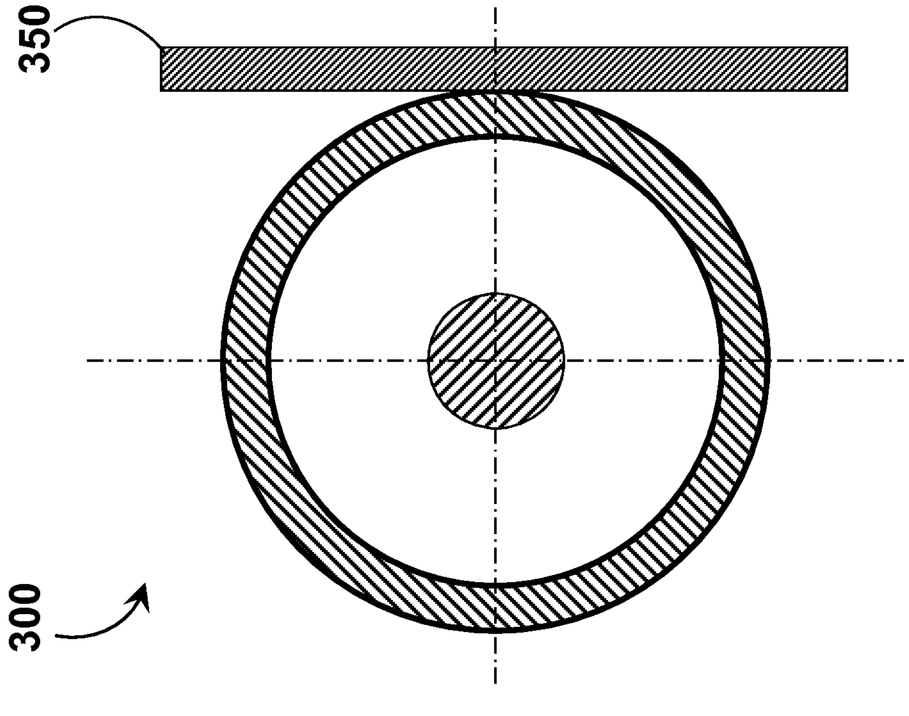
FIG. 3 is a sectional view of a cylindrical metal powder filter thermalized by physical contact with a flat surface.

FIG. 3 is a sectional view of a cylindrical metal powder filter 300 thermalized by physical contact with a flat surface 350. Filter 300 is substantially similar to filter 100 illustrated in FIG. 1 and includes all of the features described therefor. The contact area between filter 300 and surface 350 is limited by the circular cross section of the filter 300. Surface 350 may represent, for example, a flat cold surface within a cryogenic refrigeration system. In accordance with the present systems and devices, a tubular metal powder filter may employ a non-circular cross section to facilitate thermalization by physical contact with a flat surface.

Figure 4:
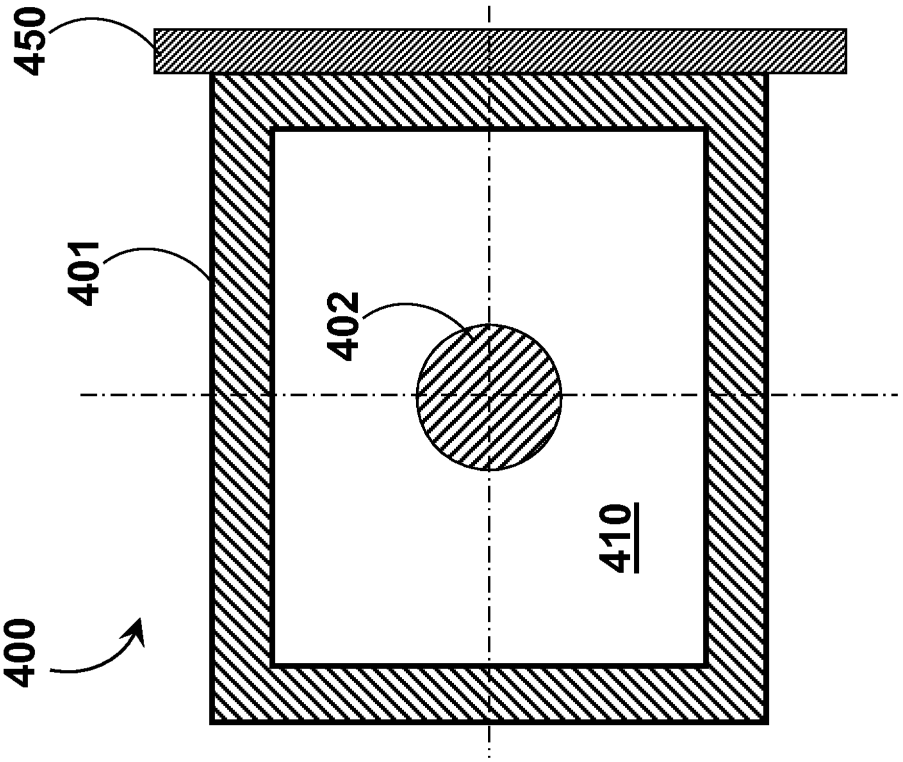
FIG. 4 is a sectional view of a tubular metal powder filter that employs a rectangular cross section according to an embodiment of the present systems and devices.

FIG. 4 is a sectional view of a tubular metal powder filter 400 that employs a rectangular cross section. Filter 400 includes an inner conductive wire 402 that extends within an outer conductive housing 401, where the outer conductive housing 401 has a geometry similar to that of a rectangular prism. Filter 400 therefore encloses a rectangular volume 410 defined between the inner surface of the outer conductive housing 401 and the outer surface of the inner conductive wire 402. Rectangular volume 410 is filled with a mixture of metal powder and epoxy (not shown in the Figure). In the illustrated embodiment, filter 400 is thermalized to a flat surface 450 by direct physical contact therewith. Due to the fact that filter 400 employs a rectangular cross section, the contact surface area between filter 400 and flat surface 450 is considerably larger than the contact surface area between filter 300 and flat surface 350 from FIG. 3, meaning that filter 400 may be more efficiently cooled than filter 300 in cryogenic applications. In alternative embodiments, filter 400 may employ any non-circular cross sectional geometry. For example, filter 400 may employ a triangular cross section, a pentagonal cross section, a hexagonal cross section, etc., or a trapezoidal cross section, a parallelogrammatic cross section, or any cross section that includes at least one substantially flat outer edge. In applications that implement multiple individual filters 400, employing a cross section that includes at least one substantially flat outer edge may enable the filters to be packed more tightly together (with better thermal contact therebetween) so that more filters may fit within a given volume inside a cryogenic refrigeration system.

The inner volume of filter 400 comprises a longitudinal passage 410 having a rectangular cross sectional geometry that matches the rectangular cross sectional geometry of outer conductive housing 401. Passage 410 is filled with a metal powder epoxy mixture (not shown in the Figure). In alternative embodiments, the cross sectional geometry of the longitudinal passage 410 may not be the same as the cross sectional geometry of the outer conductive housing 401. For example, longitudinal passage 410 may have a circular cross sectional geometry within an outer conductive housing 401 that has a rectangular cross sectional geometry, or longitudinal passage 410 may have a rectangular cross sectional geometry within an outer conductive housing 401 that has a circular cross sectional geometry, and so on.

In fabricating a metal powder filter according to the coaxial Martinis Design (e.g., filter 100 from FIG. 1), it can be challenging to initially align the inner conductive wire 102 coaxially within the outer conductive housing 101 and also to maintain that alignment while the filter is potted with the metal powder epoxy mixture. In accordance with the present systems and devices, these fabrication challenges may be reduced by replacing the inner conductive wire 102 with a fitted PCB carrying a conductive trace.

Figure 5:
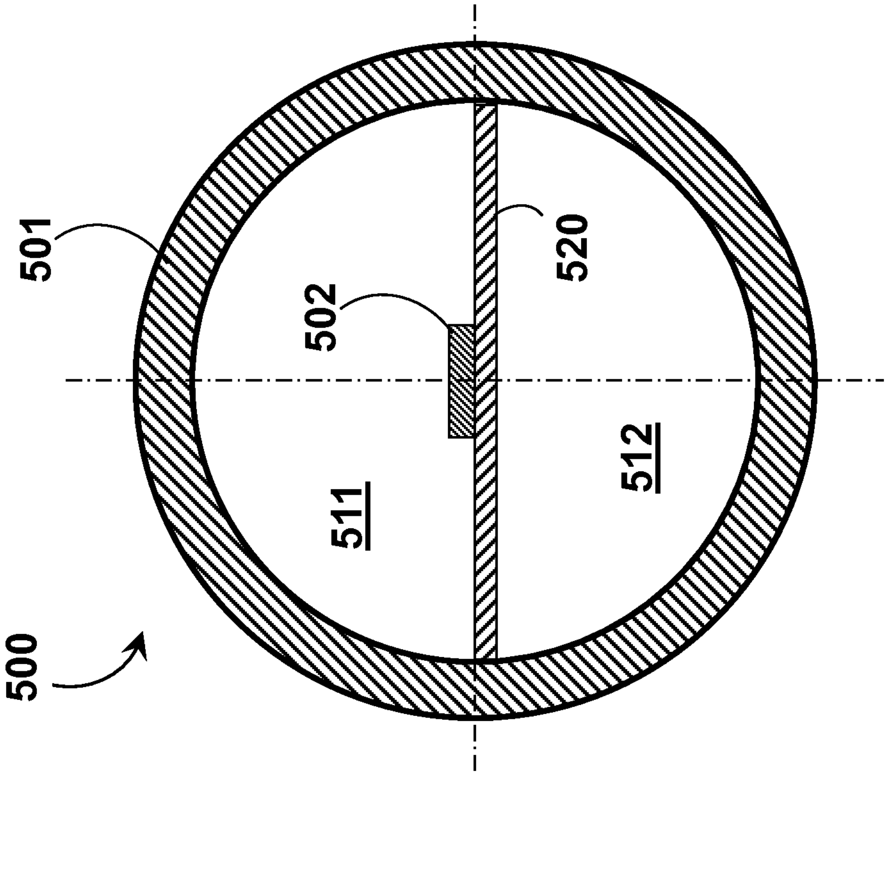
FIG. 5 is a sectional view of a coaxial metal powder filter in which the inner conductor is realized using a conductive trace carried on a PCB according to an embodiment of the present systems and devices.

FIG. 5 is a sectional view of a coaxial metal powder filter 500 in which the inner conductor is realized using a conductive trace 502 carried on a PCB 520. The width of PCB 520 may be approximately equal to the inner diameter of outer conductive housing 501 such that PCB 520 fits snugly (e.g., an interference fit) inside housing 501. In this situation, conductive trace 502 will be substantially coaxially aligned with housing 501 as long as conductive trace 502 is substantially centrally positioned on PCB 520. By applying standard practices in the fabrication of PCB 520, conductive trace 502 may be centrally positioned thereon with a high degree of precision. Therefore, a coaxial alignment in filter 500 may be much more easily achieved than a coaxial alignment in the Martinis Design (e.g., filter 100). PCB 520 effectively divides the inner volume of housing 501 into two semi-cylinders 511 and 512, both of which are filled with a metal powder epoxy mixture (not shown in the Figure).

While filter 500 may readily achieve a substantially coaxial geometry, the characteristic impedance of filter 500 may not be accurately described by equation 1. This is because the inner conductor in filter 500 (i.e., conductive trace 502) has a rectangular cross section and therefore does not have a diameter y. This distinction between the geometries of filters 500 and 100 means that the characteristic impedance of filter 500, though still capable of being modeled and predicted, may be distinct from that of filter 100. Furthermore, replacing inner conductive wire 102 from filter 100 with a PCB 520 carrying a conductive trace 502 can greatly facilitate the fabrication of off-center coaxial filter geometries, such as that described for filter 200. Simply by fabricating PCB 520 such that conductive trace 502 is positioned off-center, filter 500 may readily be adapted to embody an off-center coaxial geometry.

Figure 6:
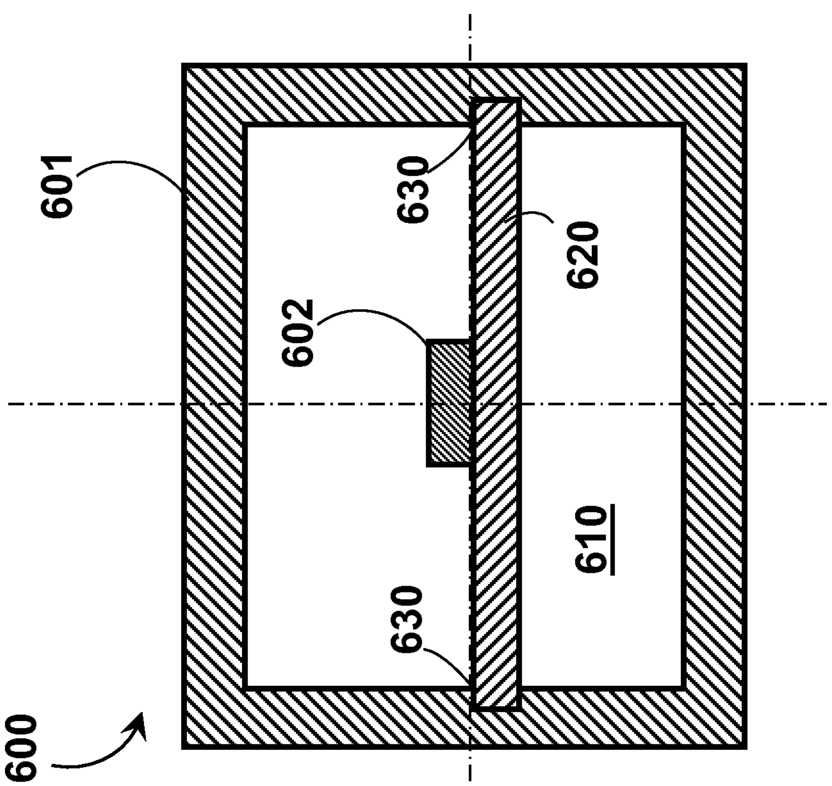
FIG. 6 is a sectional view of a metal powder filter employing a conductive trace carried by a PCB and an outer conductive housing having a non-circular cross sectional geometry according to an embodiment of the present systems and devices.

In accordance with the present systems and devices, a metal powder filter may employ a combination of the features described for filter 400 from FIG. 4 and filter 500 from FIG. 5. FIG. 6 is a sectional view of a metal powder filter 600 employing a conductive trace 602 carried by a PCB 620 and an outer conductive housing 601 having a non-circular cross sectional geometry. Outer conductive housing 601 is illustrated as having a rectangular cross section, though those of skill in the art will appreciate that, as for filter 400 from FIG. 4, any cross sectional geometry having at least one substantially flat edge may similarly be employed. In some embodiments, outer conductive housing 601 may include slots 630 sized for receiving the edges of PCB 620. Slots 630 may serve to secure PCB 620 (and, therefore conductive trace 602) in a desired position within housing 601.

As previously described, metal powder filters have particular utility in superconducting applications, such as in the input/output system providing electrical communication to/from a superconducting computer processor (e.g., a superconducting quantum processor). For example, a multi-metal powder filter assembly is employed for this purpose in U.S. patent application Ser. No. 12/016,801, where the multi-filter assembly includes a single conductive volume through which multiple through-holes are bored to provide a set of longitudinal passages. Each filter is realized by a respective coiled conductive wire (i.e., the coiled variant of the Martinis Design) extending through each passage, where the volume of each passage is filled with a mixture of metal powder and epoxy. In accordance with the present systems and devices, a similar multi-filter configuration may be formed using coaxial filters.

Figure 7:
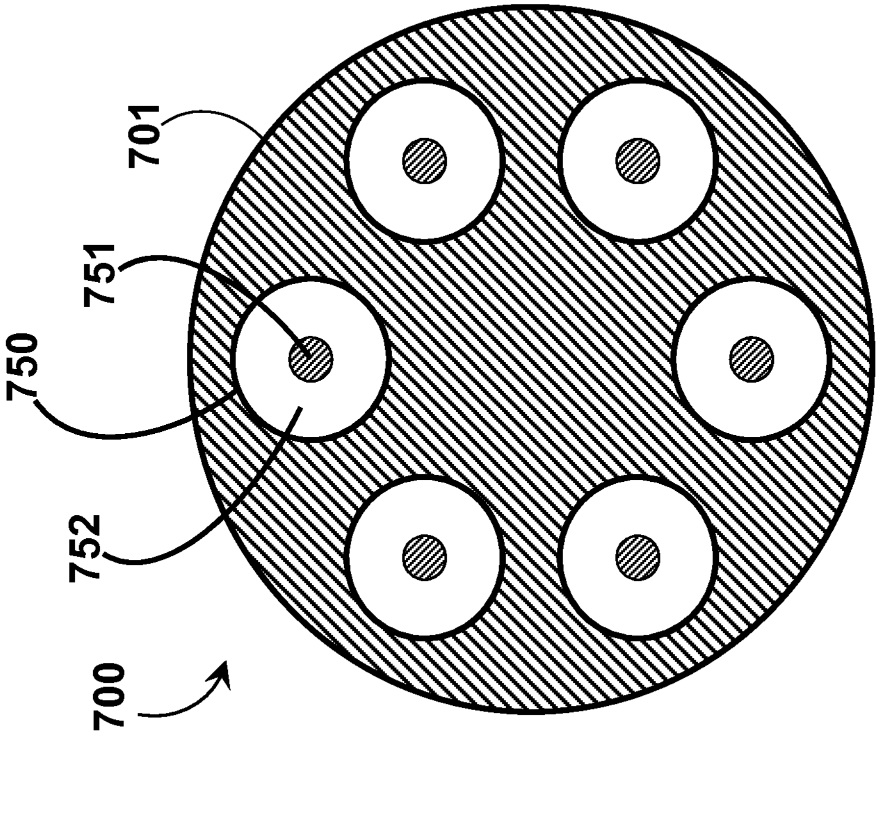
FIG. 7 is a sectional view of a multi-filter assembly including a common outer conductive housing enclosing multiple individual coaxial metal powder filters according to an embodiment of the present systems and devices.

FIG. 7 is a sectional view of a multi-filter assembly 700 including a common outer conductive housing 701 enclosing six individual coaxial metal powder filters 750 (only one called out in the Figure). Each of filters 750 includes a respective inner conductive wire 751 (only one called out in the Figure) that extends straight through and is coaxially aligned with a respective longitudinal passage 752 (only one called out in the Figure) in housing 701. The remaining volume in each passage 752 is filled with a metal powder epoxy mixture (not shown in the Figure). In applications where multiple filters are required, implementing a multi-filter assembly such as assembly 700 can improve the packing density of filters and ensure that each filter is operated at substantially the same temperature. Those of skill in the art will appreciate that assembly 700 includes six individual filters 750 for exemplary purposes only and, in alternative embodiments, any number of individual filters 750 may similarly be combined within the same common outer conductive housing 701. Furthermore, while each longitudinal passage 752 in assembly 700 employs a circular cross section, alternative cross sectional geometries (such as rectangular, triangular, hexagonal, etc.) may similarly be employed. In alternative embodiments, common outer conductive housing 701 may employ a non-circular cross sectional geometry. Because each of filters 750 shares a common outer conductive housing 701, the characteristic impedance of each filter 750 may be described by an equation that is different from equation 1.

Figure 8:
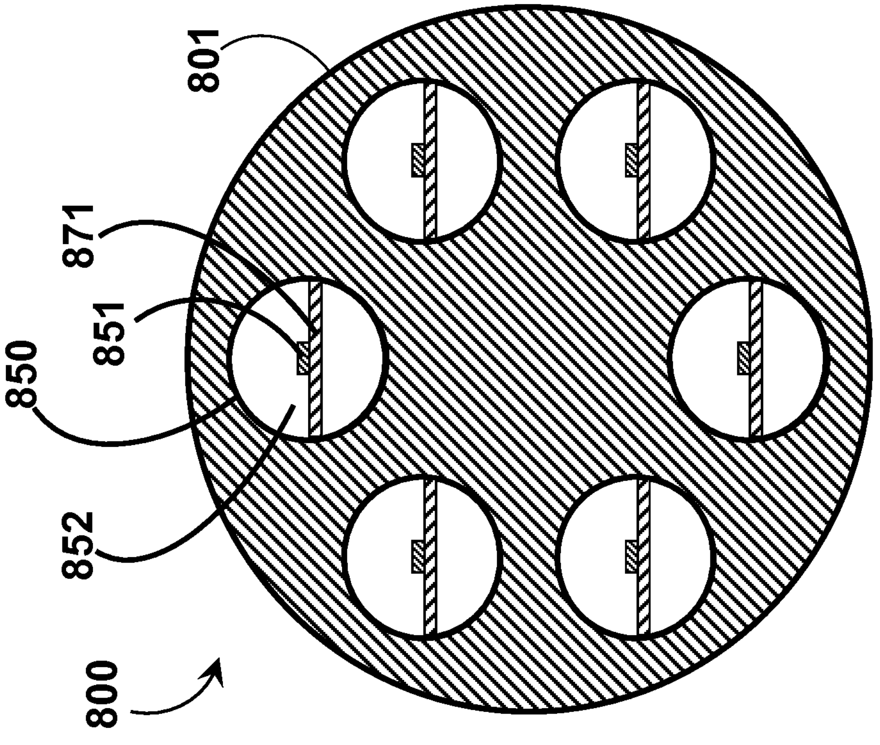
FIG. 8 is a sectional view of a multi-filter assembly including a common outer conductive housing enclosing multiple individual PCB-based coaxial metal powder filters according to an embodiment of the present systems and devices.

In accordance with the present systems and devices, a multi-filter assembly may employ conductive traces carried by PCBs rather than conductive wires as the inner conductors in the individual filters. FIG. 8 is a sectional view of a multi-filter assembly 800 including a common outer conductive housing 801 enclosing six individual coaxial metal powder filters 850 (only one called out in the Figure). Each of filters 850 includes a respective conductive trace 851 (only one called out in the Figure) carried on a respective PCB 871 (only one called out in the Figure) that extends straight through and is coaxially aligned with a respective longitudinal passage 852 (only one called out in the Figure) in housing 801. The remaining volume in each passage 852 is filled with a metal powder epoxy mixture (not shown in the Figure). As previously stated, the fabrication of a metal powder filter may be simplified by implementing a PCB as the inner conductor, therefore the fabrication of multi-filter assembly 800 may, at least in some applications, be simpler and more reliable than the fabrication of multi-filter assembly 700. Those of skill in the art will appreciate that assembly 800 may employ any number of individual filters 850 and any cross sectional geometry for each passage 852 and/or for the common outer conductive housing 801.

Figure 9:
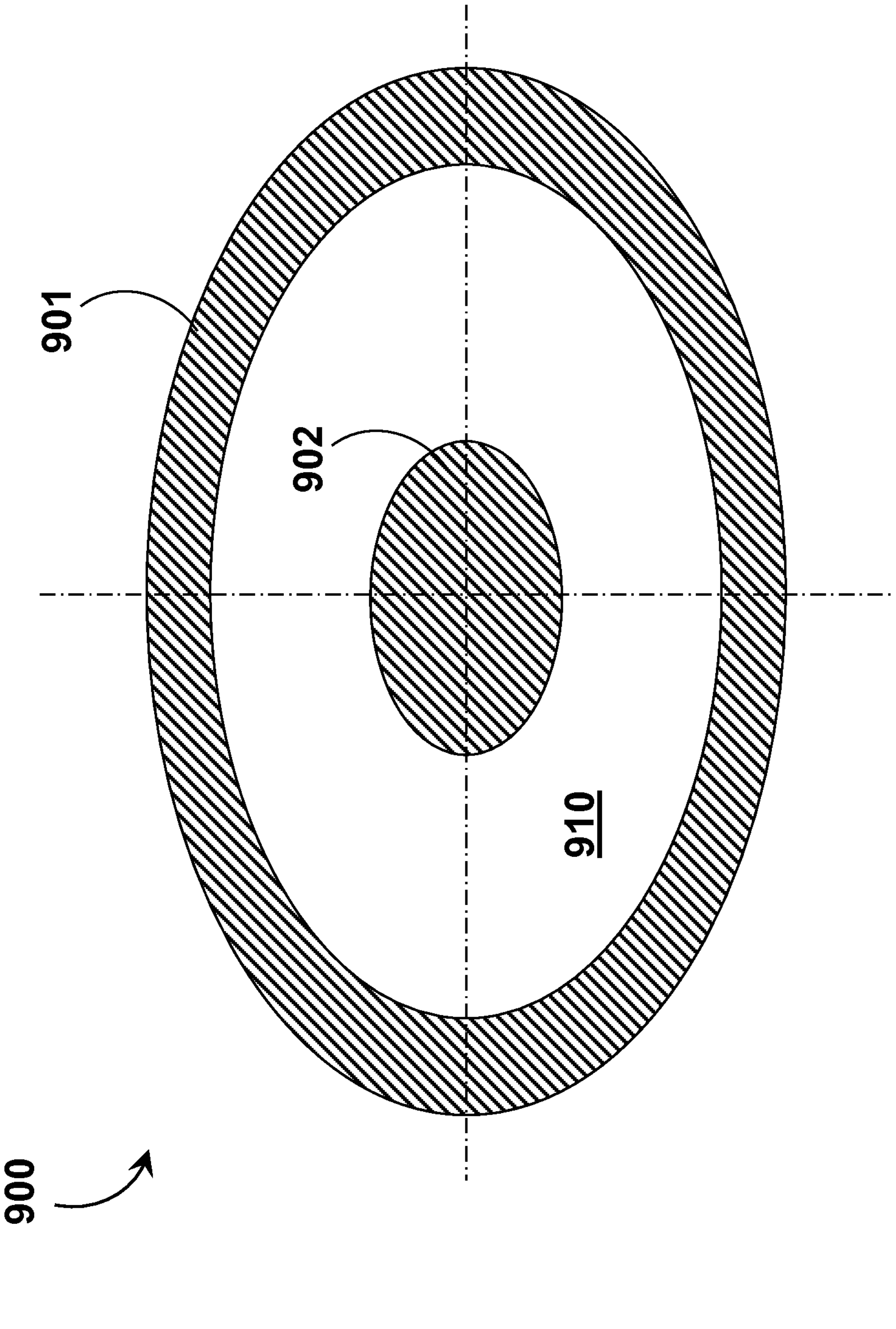
FIG. 9 is a sectional view of a tubular metal powder filter in which both the outer conductive housing and the longitudinal passage therethrough have an elliptical cross sectional geometry according to an embodiment of the present systems and devices.

In some embodiments of the present systems and devices, it may be advantageous to employ a metal powder filter having an elliptical cross sectional geometry. FIG. 9 is a sectional view of a tubular metal powder filter 900 in which both the outer conductive housing 901 and the longitudinal passage 910 therethrough have an elliptical cross sectional geometry. Filter 900 includes an inner conductor embodied by an elliptical conductive wire 902 that is aligned substantially coaxially within passage 910. The elliptical volume of passage 910 is filled with a metal powder epoxy mixture (not shown in the Figure). In alternative embodiments, elliptical filter 900 may employ a PCB carrying a conductive trace as the inner conductor instead of conductive wire 902. Filter 900 has a predictable characteristic impedance Z that is not given by equation 1, but rather is given by equation 4 (taken from Illarionov et al., "Calculation of Corrugated and partially Filled Waveguides" Moscow, Soviet Radio, 1980 [Printed in Russian]):

$$Z = \frac{60}{\sqrt{E}}(A_2 - A_1) \quad (4)$$

where E is the dielectric constant of the metal powder epoxy mixture, $A_2$ is the inner perimeter of the other conductive housing 901, and $A_1$ is the outer perimeter of the inner conductive wire 902. However, while filter 900 employs an inner conductive wire 902 having an elliptical cross sectional geometry, those of skill in the art will appreciate that an inner conductive wire having any cross sectional geometry (e.g., circular, rectangular, hexagonal, etc.) may similarly be used.

Referring again to FIG. 1, the path taken by the inner conductive wire 101 within the outer conductive housing 102 directly affects the performance of the filter 100. For example, the path taken by the inner conductive wire 101 influences both the filtering properties and the characteristic impedance of filter 100. As previously discussed, in some applications a coiled inner conductive wire is preferable (i.e., the coiled variant of the Martinis Design) and in other applications a straight, coaxial inner conductive wire is preferable (i.e., the coaxial variant of the Martinis Design). Each of the filter designs illustrated in FIGS. 1-9 employs a straight inner conductive wire that is either aligned coaxially or deliberately off-center within the outer conductive housing. However, in accordance with the present systems and devices, it may be advantageous in some applications for the inner conductor to follow a path that is not straight, such as a meandering, crenulated or serpentine path.

Figure 10:
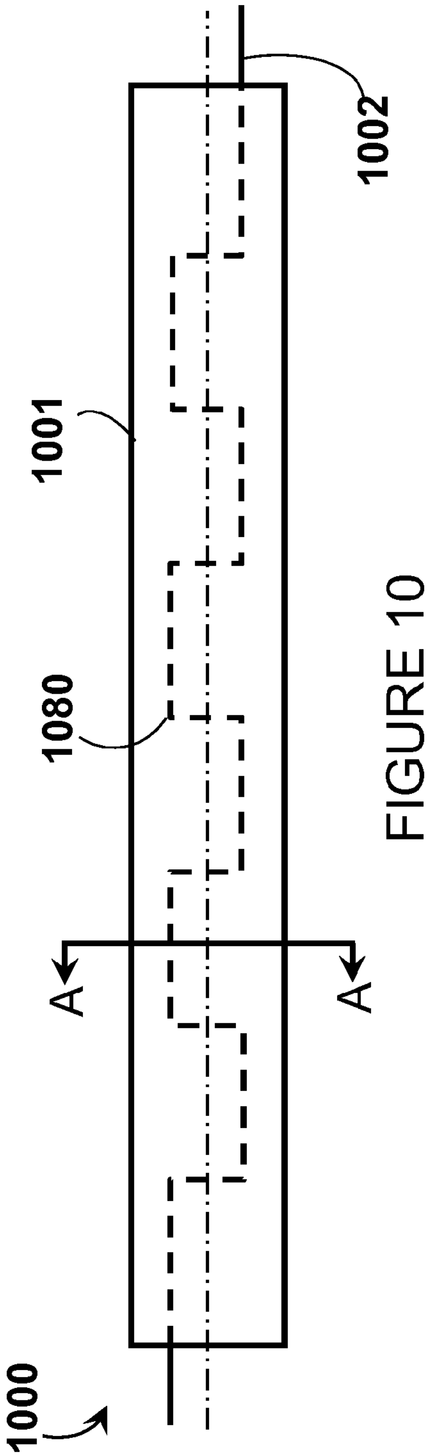
FIG. 10 is a top plan view of a tubular metal powder filter including an outer conductive housing through which extends a meandering inner conductor according to an embodiment of the present systems and devices.

FIG. 10 is a top plan view of a tubular metal powder filter 1000 including an outer conductive housing 1001 through which extends an inner conductor 1002. In the illustrated embodiment, inner conductor 1002 follows a meandering, crenulated, and/or serpentine path through the length of outer conductive housing 1001, such that inner conductor 1002 is not coaxially aligned inside housing 1001. While the path of inner conductor 1002 is illustrated as comprising a series of right-angled turns 1080 (only one called out in the Figure), alternative embodiments may employ turns of any angle and/or curved turns (i.e., radii of curvature). Furthermore, the number and frequency of turns is wholly dependent on the desired characteristics of the filter 1000. Filter 1000 may employ any cross sectional geometry for the outer conductive housing 1001 and the longitudinal passage therethrough. In various embodiments, inner conductor 1002 may be embodied by a conductive wire or a conductive trace carried by a PCB. Exemplary PCBs employing meandering signal paths are described in US Patent Publication 2009-0102580. In the illustrated embodiment, filter 1000 employs a cylindrical outer conductive housing 1001 and an inner conductive wire 1002, as illustrated by a sectional view along line A-A.

Figure 11:
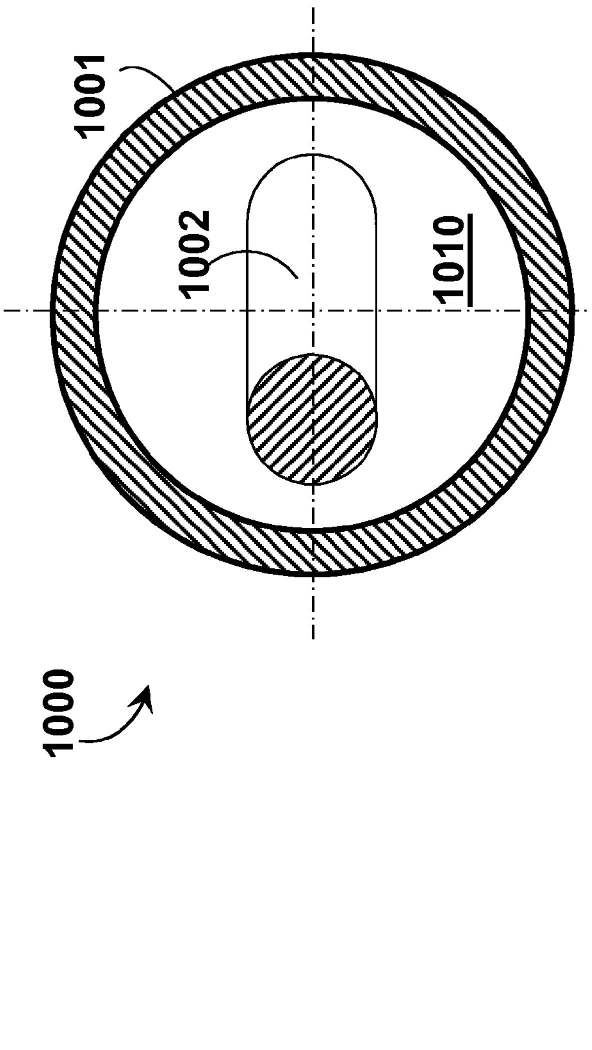
FIG. 11 is a sectional view along the line A-A from FIG. 10 showing the cross-sectional geometry of the filter.

FIG. 11 is a sectional view along the line A-A from FIG. 10 showing the cross sectional geometry of filter 1000. In this sectional view, it is apparent that the outer conductive housing 1001, the longitudinal passage 1010 extending therethrough, and the inner conductive wire 1002 all employ a circular cross sectional geometry. However, in alternative embodiments, all or any one of housing 1001, passage 1010, and wire 1002 may employ a cross sectional geometry that is not circular, such as a rectangular, triangular, pentagonal, hexagonal, trapezoidal, or parallelogrammatic cross sectional geometry. In some embodiments, all or any one of housing 1001, passage 1010, and wire 1002 may employ an irregular cross sectional geometry or a cross sectional geometry that represents a pattern such as a "+" sign, a star shape, etc. Longitudinal passage 1010 is filled with a mixture of metal powder and epoxy (not shown in the Figure).

While implementing a coiled/spiraled inner conductor (e.g., the coiled variant of the Martinis Design) may provide desirable filtering characteristics, this configuration can have a limited range of characteristic impedance. This can be due, at least in part, to capacitive coupling of high frequency signals between adjacent loops in a tightly wound coil. In accordance with the present systems and devices, at least some of the benefits of having a coiled inner conductor (e.g., desirable filtering characteristics) without the drawbacks (e.g., limited range of characteristic impedance) may be realized by implementing a coiled inner conductor with a large enough pitch to prevent significant capacitive coupling of high frequency signals between adjacent loops in the coil.

Figure 12:
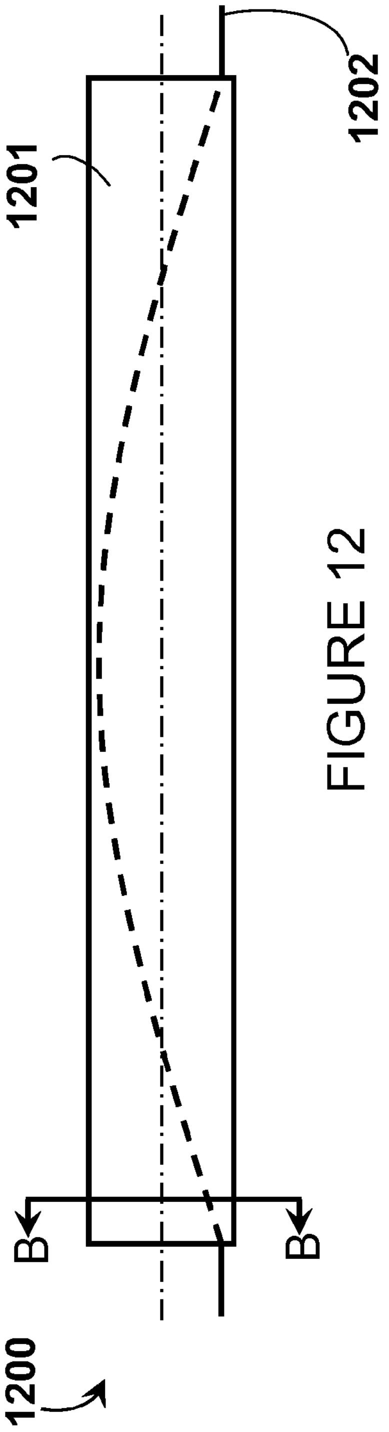
FIG. 12 is a top plan view of a tubular metal powder filter including an outer conductive housing through which extends a coiled inner conductor, where the coil has a large pitch according to an embodiment of the present systems and devices.

FIG. 12 is a top plan view of a tubular metal powder filter 1200 including an outer conductive housing 1201 through which extends an inner conductor 1202. Inner conductor 1202 is coiled with a very large pitch. In the illustrated embodiment, the pitch is so large that inner conductor 1202 only includes one large loop extending within the full length of housing 1201. Those of skill in the art will appreciate, however, that for the purposes of the present systems and devices inner conductor 1202 may be coiled with multiple loops, provided that the spacing between adjacent loops (i.e., the pitch) is large enough to prevent significant capacitive coupling therebetween. In some such embodiments, the characteristic impedance of the filter may be approximated using equation 2. Filter 1200 may employ any cross sectional geometry for the outer conductive housing 1201 and the longitudinal passage therethrough. In various embodiments, inner conductor 1202 may be embodied by a conductive wire or a series of conductive traces and vias carried by a multi-layered PCB. Exemplary multi-layered PCBs employing coil-like signal paths are described in US Patent Publication 2009-0102580. In the illustrated embodiment, filter 1200 employs a cylindrical outer conductive housing 1201 and an inner conductive wire 1202, as illustrated by a sectional view along line B-B.

Figure 13:
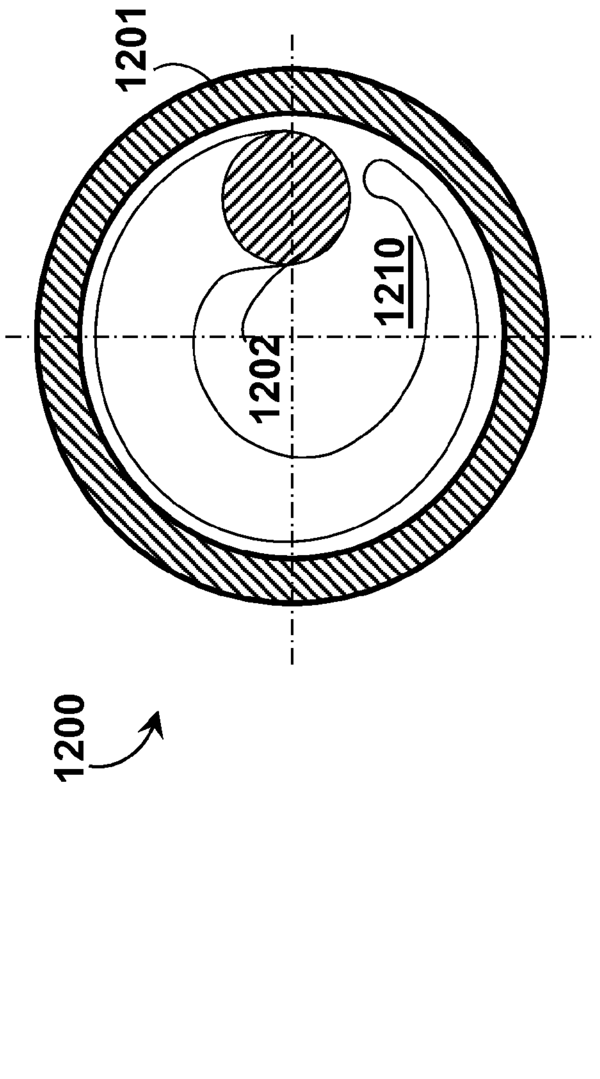
FIG. 13 is a sectional view along the line B-B from FIG. 12 showing the cross-sectional geometry of the filter.

FIG. 13 is a sectional view along the line B-B from FIG. 12 showing the cross-sectional geometry of filter 1200. In this sectional view, it is apparent that the outer conductive housing 1201, the longitudinal passage 1210 extending therethrough, and the inner conductive wire 1202 all employ a circular cross sectional geometry. However, in alternative embodiments, all or any one of housing 1201, passage 1210, and wire 1202 may employ a cross sectional geometry that is not circular, such as a rectangular, triangular, pentagonal, hexagonal, trapezoidal, volute, parallelogrammatic, irregular, or patterned cross sectional geometry. Longitudinal passage 1210 is filled with a mixture of metal powder and epoxy (not shown in the Figure).

Each of the filter designs illustrated in FIGS. 1-13 is particularly suited for applications involving single-ended signals. However, in accordance with the present systems and devices, each of the filter designs illustrated in FIGS. 1-13 may be adapted to implement differential signaling.

Figure 14:
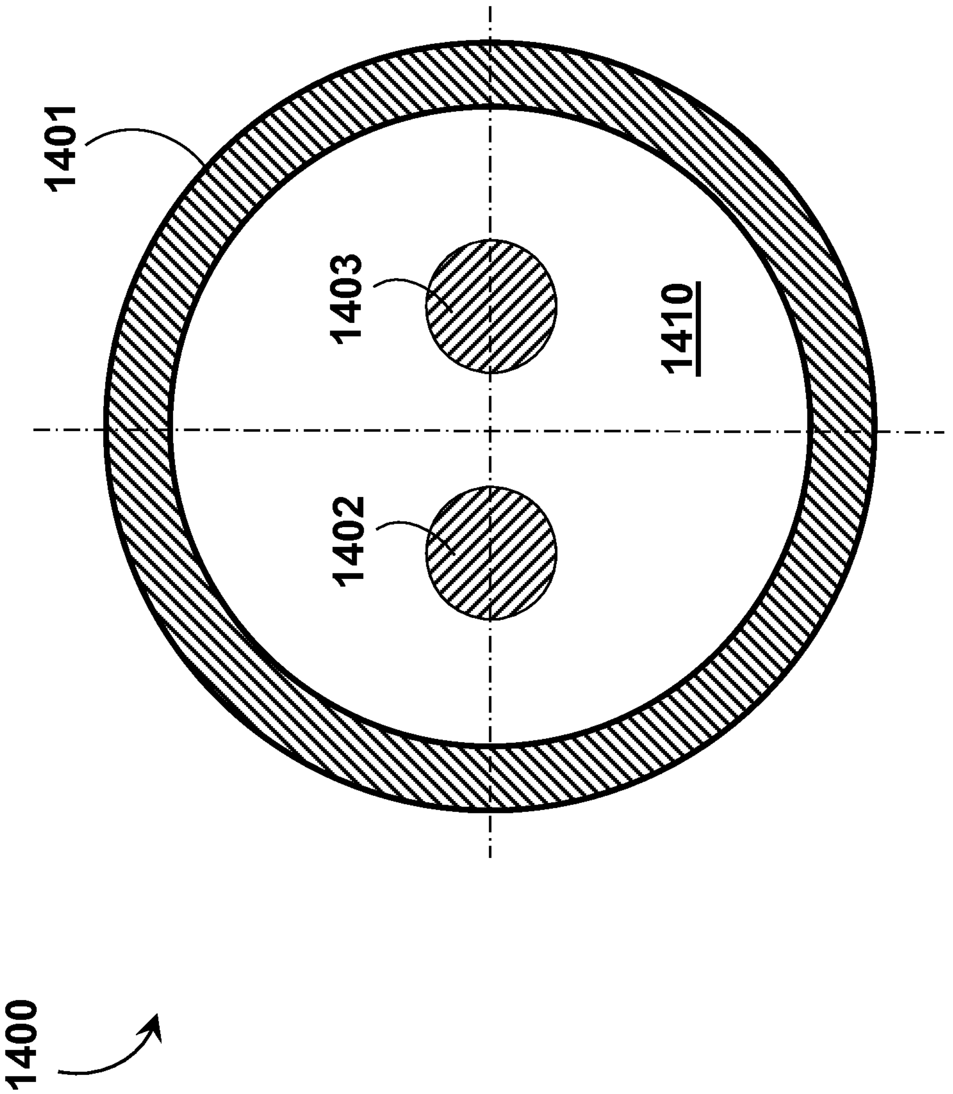
FIG. 14 is a sectional view of a tubular metal powder filter that is designed to operate with differential signals according to an embodiment of the present systems and devices.

FIG. 14 is a sectional view of a tubular metal powder filter 1400 that is designed to operate with differential signals. Filter 1400 includes an outer conductive housing 1401 and a longitudinal passage 1410 defining a cylindrical volume inside of housing 1401. Two inner conductive wires 1402, 1403 extend through longitudinal passage 1410 along the length of housing 1401, one of which (e.g., 1402) carries a data signal and the other of which (e.g., 1403) carries a complementary signal. The remaining volume of longitudinal passage 1410 is filled with a mixture of metal powder and epoxy (not shown in the Figure). In some embodiments, the two inner conductive wires 1402, 1403 may be twisted around one another to form a twisted-pair. While both inner conductive wires 1402, 1403 are illustrated as being straight (i.e., parallel to the longitudinal axis of the passage 1410), in alternative embodiments they may each be coiled or follow a meandering path as in filter 600 from FIG. 6. Those of skill in the art will appreciate that the various cross sectional geometries described herein may similarly be adapted to accommodate differential signaling. For example, outer conductive housing 1401, longitudinal passage 1410, and inner conductive wires 1402, 1403 may each embody any cross sectional geometry, including circular, rectangular, triangular, irregular, patterned, and so on.

Figure 15:
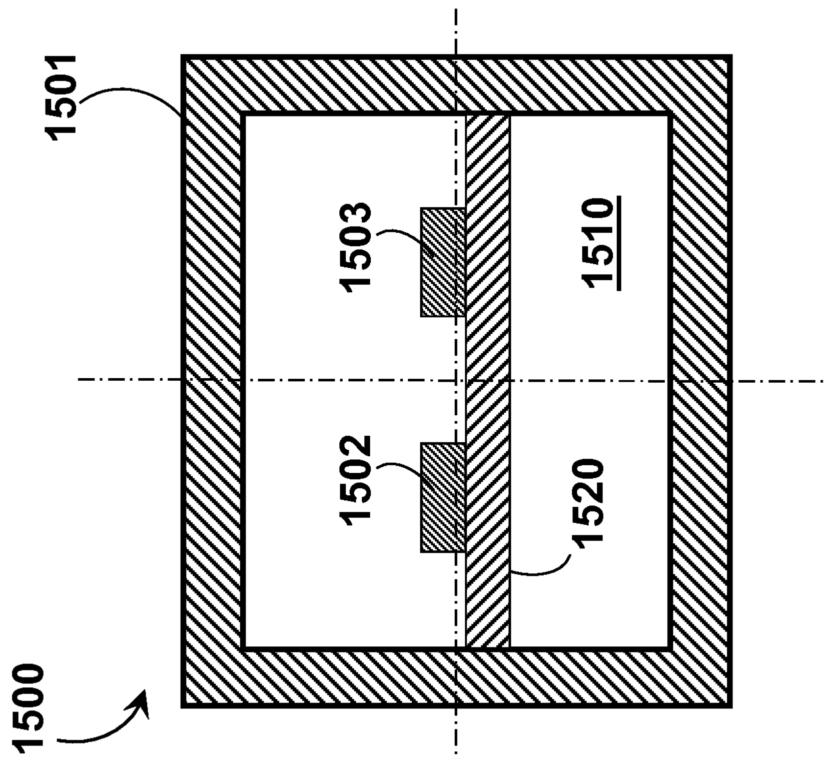
FIG. 15 is a sectional view of a PCB-based tubular metal powder filter that is designed to operate with differential signals according to an embodiment of the present systems and devices.

The embodiments of metal powder filters that employ conductive traces carried by PCBs may similarly be adapted to operate with differential signals. FIG. 15 is a sectional view of a tubular metal powder filter 1500 including an outer conductive housing 1501 with a longitudinal passage 1510 therethrough and two conductive traces 1502, 1503 carried on a PCB 1520 that extends along the length of the passage 1520. Filter 1500 employs differential signaling, with one of the conductive traces (e.g., 1502) configured to carry a data signal and the other (e.g., 1503) configured to carry a complementary signal. Conductive traces 1502 and 1503 are positioned adjacent and substantially parallel to one another on the same side of PCB 1520. In the illustrated embodiment, both outer conductive housing 1501 and longitudinal passage 1510 have a rectangular cross sectional geometry, though in alternative embodiments either or both of housing 1501 and passage 1510 may have a non-rectangular (e.g., circular, triangular, etc.) cross sectional geometry. The remaining volume of passage 1510 is filled with a metal powder epoxy mixture (not shown in the Figure).

Figure 16:
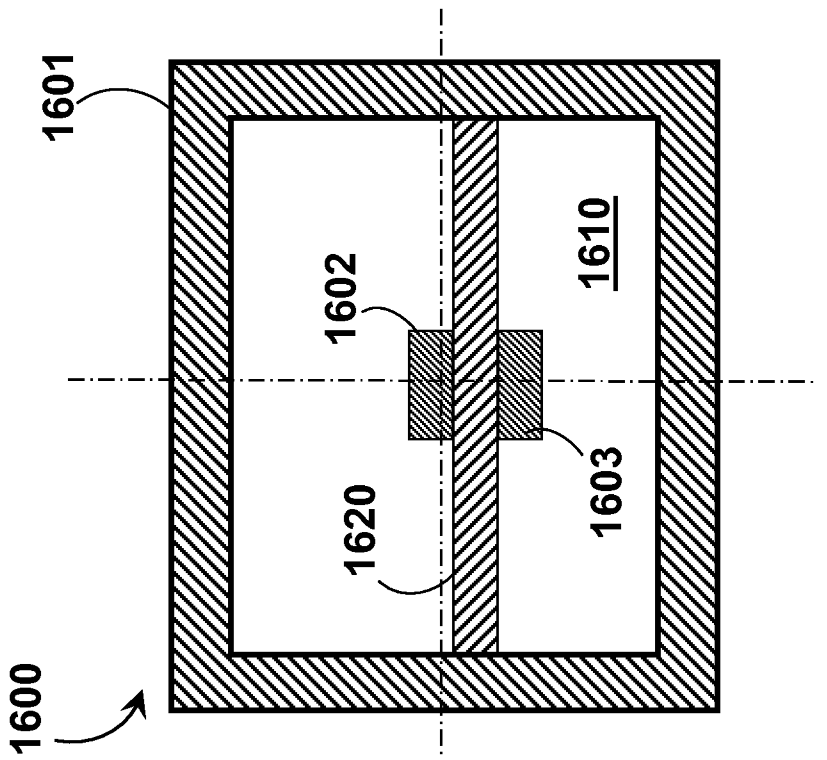
FIG. 16 is a sectional view of an alternative PCB-based tubular metal powder filter that is designed to operate with differential signals according to another embodiment of the present systems and devices.

As an alternative to having both conductive traces 1502, 1503 on the same side of PCB 1520, the two conductive traces may be positioned on opposite faces of the PCB. FIG. 16 is a sectional view of a tubular metal powder filter 1600 including an outer conductive housing 1601 with a longitudinal passage 1610 therethrough and two conductive traces 1602, 1603 carried on a PCB 1620 that extends along the length of the passage 1610. Filter 1600 employs differential signaling, with one of the conductive traces (e.g., 1602) configured to carry a data signal and the other (e.g., 1603) configured to carry a complementary signal. Conductive trace 1602 is carried on a first surface of PCB 1620 and conductive trace 1603 is carried on a second surface of PCB 1620. The remaining volume of passage 1610 is filled with a mixture of metal powder and epoxy (not shown in the Figure).

The various embodiments described herein may be employed in both superconducting and non-superconducting applications. In superconducting applications, the inner conductor(s) (e.g., conductive wire 202, 402, 751, 902, 1002, 1202, 1402, and/or 1403; or conductive traces 502, 602, 851, 1502, 1503, 1602, and/or 1603) may be formed of a material that is superconducting below a critical temperature. Exemplary materials include niobium, aluminum, tin, and lead, though those of skill in the art will appreciate that other superconducting materials may be used. It is generally preferable that the outer conductive housing of a metal powder filter be formed of a material that is not superconducting. Exemplary materials include copper and brass, though those of skill in the art will appreciate that other non-superconducting materials may be used.

Throughout this specification and the appended claims, reference is often made to "metal powder," "a mixture of metal powder and epoxy," and "a metal powder epoxy mixture." In general, it is preferable that the metal implemented in such powders/mixtures be non-superconducting. Exemplary materials include copper powder and brass powder, though those of skill in the art will appreciate that other materials may be used. In some embodiments, the "metal powder" may comprise fine metal grains. In alternative embodiments, the "metal powder" may comprise large metal pieces such as metal filings and/or wire clippings or microscopic metal particles such as nanocrystals. The term "epoxy" is used herein to refer to a substance that provides the chemical functionality associated with an epoxide (i.e., a cyclic ether having three ring atoms; namely, two carbon atoms and one oxygen atom), and more generally to the reaction product of molecules containing multiple epoxide groups (an epoxy resin) with various chemical hardeners to form a solid material, as will be appreciated by those of skill in the chemical arts.

Certain aspects of the present systems and devices may be realized at room temperature, and certain aspects may be realized at a superconducting temperature. Thus, throughout this specification and the appended claims, the term "superconducting" when used to describe a physical structure such as a "superconducting wire" is used to indicate a material that is capable of behaving as a superconductor at an appropriate temperature. A superconducting material may not necessarily be acting as a superconductor at all times in all embodiments of the present systems and devices. It is also noted that the teachings provided herein may be applied in non-superconducting applications, such as in radio frequency transformers formed out of gold.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other systems, methods and apparatus, not necessarily the exemplary systems, methods and apparatus generally described above.

The various embodiments described above can be combined to provide further embodiments. All of the U.S. patents, U.S. patent application publications, U.S. patent applications, including but not limited to U.S. Provisional Patent Application Ser. No. 61/298,070, filed Jan. 25, 2010, and entitled "Systems and Devices For Electrical Filters," U.S. Pat. No. 7,456,702, US Patent Application Publication 2009-0085694 (now U.S. Pat. No. 7,791,430), US Patent Application Publication US 2008-0284545, U.S. patent application Ser. No. 12/016,801, US Patent Publication 2008-0176751, U.S. patent application Ser. No. 12/503,671 (now U.S. Patent Application Publication 2010-0157552), and US Patent Application Publication 2009-0102580, are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electrical filter comprising:

a tubular outer conductor having an outer surface and a longitudinal passage;

a first inner conductor that extends through the longitudinal passage, wherein the first inner conductor comprises a first conductive trace carried by a printed circuit board; and a filler material comprising a metal powder, the filler material disposed in the longitudinal passage, wherein the outer conductor has an inner diameter, and wherein a width of the printed circuit board is approximately equal to the inner diameter of the outer conductor.

2. The electrical filter of claim 1 wherein the first inner conductor comprises a first superconductive trace carried by the printed circuit board.

3. The electrical filter of claim 1 wherein the longitudinal passage has a longitudinal center axis and the first conductive trace extends parallel to the longitudinal center axis of the longitudinal passage.

4. The electrical filter of claim 3 wherein the first conductive trace extends collinearly with the longitudinal center axis of the longitudinal passage.

5. The electrical filter of claim 1 wherein the longitudinal passage has a longitudinal center axis, and wherein the first conductive trace follows a meandering path through the longitudinal passage, the meandering path characterized by at least one change in direction with respect to the longitudinal center axis.

6. The electrical filter of claim 1 wherein the filler material includes an epoxy and the metal powder includes at least one of copper powder or brass powder.

7. The electrical filter of claim 1 wherein the outer surface of the tubular outer conductor has a cross sectional geometry that is non-circular.

8. The electrical filter of claim 1, further comprising:

a second inner conductor that extends through the longitudinal passage, wherein the second inner conductor comprises a second conductive trace carried by the printed circuit board.

9. The electrical filter of claim 8 wherein the second inner conductor is configured to carry a complementary signal.

10. The electrical filter of claim 8 wherein the second inner conductor comprises a second superconductive trace carried by the printed circuit board.

11. The electrical filter of claim 8 wherein the longitudinal passage has a longitudinal center axis and both the first conductive trace and the second conductive trace extend parallel to the longitudinal center axis of the longitudinal passage.

12. An electrical filter comprising:

a tubular outer conductor having an outer surface and a longitudinal passage, wherein the outer surface of the tubular outer conductor has a cross sectional geometry that is non-circular;

a first inner conductor that extends through the longitudinal passage, wherein the first inner conductor comprises a first conductive trace carried by a printed circuit board; and a filler material comprising a metal powder, the filler material disposed in the longitudinal passage.

13. The electrical filter of claim 12 wherein the first inner conductor comprises a first superconductive trace carried by the printed circuit board.

14. The electrical filter of claim 12 wherein the longitudinal passage has a longitudinal center axis and the first conductive trace extends parallel to the longitudinal center axis of the longitudinal passage.

15. The electrical filter of claim 14 wherein the first conductive trace extends collinearly with the longitudinal center axis of the longitudinal passage.

16. The electrical filter of claim 12 wherein the longitudinal passage has a longitudinal center axis, and wherein the first conductive trace follows a meandering path through the longitudinal passage, the meandering path characterized by at least one change in direction with respect to the longitudinal center axis.

17. The electrical filter of claim 12 wherein the outer conductor has an inner diameter, and wherein a width of the printed circuit board is approximately equal to the inner diameter of the outer conductor.

18. The electrical filter of claim 12 wherein the filler material includes an epoxy and the metal powder includes at least one of copper powder or brass powder.

19. The electrical filter of claim 12, further comprising:

a second inner conductor that extends through the longitudinal passage, wherein the second inner conductor comprises a second conductive trace carried by the printed circuit board.

20. The electrical filter of claim 19 wherein the second inner conductor is configured to carry a complementary signal.

21. The electrical filter of claim 19 wherein the second inner conductor comprises a second superconductive trace carried by the printed circuit board.

22. The electrical filter of claim 19 wherein the longitudinal passage has a longitudinal center axis and both the first conductive trace and the second conductive trace extend parallel to the longitudinal center axis of the longitudinal passage.

23. An electrical filter comprising:

a tubular outer conductor having an outer surface and a longitudinal passage;

a first inner conductor that extends through the longitudinal passage, wherein the first inner conductor comprises a first conductive trace carried by a printed circuit board; and a filler material comprising a metal powder, the filler material disposed in the longitudinal passage, wherein the outer conductor has an inner cross sectional width spanning along a major axis, and wherein a width of the printed circuit board is approximately equal to the inner cross sectional width of the outer conductor.

24. The electrical filter of claim 23 wherein the first inner conductor comprises a first superconductive trace carried by the printed circuit board.

25. The electrical filter of claim 23 wherein the outer conductor has an outer cross sectional width spanning along the major axis of the outer conductor, the outer cross sectional width being larger than the inner cross sectional width and wherein the width of the printed circuit board is larger than the inner cross sectional width of the outer conductor and smaller than the outer cross sectional width of the outer conductor.

26. The electrical filter of claim 25 wherein the inner conductor comprises at least one slot for receiving at least one edge of the printed circuit board.

27. The electrical filter of claim 23 wherein the outer surface of the tubular outer conductor has a cross sectional geometry that is non-circular.

* * * * *